(12) United States Patent
Tseng et al.

(10) Patent No.: US 10,486,962 B2
(45) Date of Patent: Nov. 26, 2019

(54) FORCE SENSOR AND MANUFACTURE METHOD THEREOF

(71) Applicant: MiraMEMS Sensing Technology Co., Ltd, Suzhou (CN)

(72) Inventors: Li-Tien Tseng, Taoyuan (TW); Yu-Hao Chien, Taipei (TW); Chih-Liang Kuo, Hsinchu (TW); Yu-Te Yeh, Hsinchu (TW)

(73) Assignee: MIRAMEMS SENSING TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 15/993,058

(22) Filed: May 30, 2018

(65) Prior Publication Data

US 2019/0330053 A1 Oct. 31, 2019

(30) Foreign Application Priority Data

Apr. 27, 2018 (CN) .......................... 2018 1 0391387

(51) Int. Cl.
| | | |
|---|---|---|
| *H01L 29/84* | (2006.01) | |
| *B81B 7/00* | (2006.01) | |
| *B81C 1/00* | (2006.01) | |
| *G01L 1/14* | (2006.01) | |

(52) U.S. Cl.
CPC .......... *B81B 7/0051* (2013.01); *B81C 1/0023* (2013.01); *G01L 1/148* (2013.01); *B81B 2201/0264* (2013.01); *B81B 2203/04* (2013.01); *B81B 2207/012* (2013.01); *B81C 2203/0785* (2013.01)

(58) Field of Classification Search
CPC ...... B81B 7/0051; B81C 1/0023; G01L 1/148
USPC ......................................................... 257/417
See application file for complete search history.

(56) References Cited

U.S. PATENT DOCUMENTS

| | | | | |
|---|---|---|---|---|
| 7,705,612 B2* | 4/2010 | Morimoto | ............ | G01D 5/2412 |
| | | | | 324/661 |
| 8,921,958 B2* | 12/2014 | Ikehashi | ............... | B81B 3/0018 |
| | | | | 257/254 |
| 9,274,017 B2* | 3/2016 | Nakamura | ............ | G01L 9/0072 |
| 10,139,456 B2* | 11/2018 | Nakatani | ............ | G01R 33/0286 |
| 2015/0259196 A1* | 9/2015 | Nakamura | ............ | B81B 7/0038 |
| | | | | 257/415 |

(Continued)

FOREIGN PATENT DOCUMENTS

| | | |
|---|---|---|
| TW | 201402451 A | 1/2014 |
| TW | 201601325 A | 1/2016 |

*Primary Examiner* — Luan C Thai
(74) *Attorney, Agent, or Firm* — Muncy, Geissler, Olds & Lowe, P.C.

(57) ABSTRACT

A force sensor comprises a first substrate, a second substrate, a third substrate, and a package body. The first substrate includes a fixed electrode, at least one first conductive contact, and at least one second conductive contact. The second substrate is disposed on the first substrate and electrically connected to the first conductive contact of the first substrate. The second substrate includes a micro-electro-mechanical system (MEMS) element corresponding to the fixed electrode. The third substrate is disposed on the second substrate and includes a pillar connected to the MEMS element. The package body covers the third substrate. The foregoing force sensor has better reliability.

14 Claims, 10 Drawing Sheets

(56) References Cited

U.S. PATENT DOCUMENTS

| | | | |
|---|---|---|---|
| 2015/0292970 A1* | 10/2015 | Gando | G01L 9/0072 73/724 |
| 2017/0283250 A1 | 10/2017 | Liu et al. | |
| 2017/0336435 A1* | 11/2017 | Tseng | G01P 15/125 |

* cited by examiner

FORCE SENSOR AND MANUFACTURE METHOD THEREOF

BACKGROUND OF THE INVENTION

1. Field of the Invention

The present invention relates to a force sensor and a manufacture method thereof, particularly to a MEMS-based force sensor and a manufacture method thereof.

2. Description of the Prior Art

Since the concept of the microelectromechanical system (MEMS) emerged in 1970s, MEMS devices have evolved from the targets explored in laboratories into the objects integrated with high-level systems. Nowadays, MEMS-based devices have been extensively used in consumer electronics, and the application thereof is still growing stably and fast. A MEMS-based device includes a mobile MEMS component. The function of a MEMS-based device may be realized through measuring the physical magnitude of the movement of the MEMS component. The force sensor is an example of MEMS devices, able to detect a pressing action or a pressing force.

The conventional force sensors include the piezoresistor type pressure sensor and the capacitor type pressure sensor. Refer to FIG. 1. In a conventional piezoresistor type pressure sensor, a plurality of piezoresistors 12 is disposed on a mobile membrane 11. While a pressing force causes the mobile membrane 11 to deform, the piezoresistors 12 generate corresponding signals. Refer to FIG. 2. A conventional capacitor type pressure sensor includes a mobile membrane 21 and a fixed electrode 22, and the mobile membrane 21 is disposed opposite to the fixed electrode 22, whereby is formed a sensing capacitor. The signals generated by the sensing capacitor are transmitted to an Application Specific Integrated Circuit (ASIC) chip 24 through a lead 23 and processed by the ASIC chip 24. It is easily understood: a package body 25 is needed to package and protect the abovementioned components. A pressing force is conducted through the package body 25 to cause the deformation of the mobile membrane 21 and make the sensing capacitor output corresponding signals.

In view of the abovementioned structures, repeated pressing actions may degrade the reliability of the package body 25 and/or wire bonding structure, or even damage the mobile membrane. Besides, the magnitude of the stress generated by pressing actions can only be controlled via modifying the thickness of the package body 25. Thus, the force sensors for different scales of force are hard to be packaged with a standard package process. Therefore, upgrading the reliability of force sensors and standardizing the package process has become a target the manufacturers are eager to achieve.

SUMMARY OF THE INVENTION

The present invention provides a force sensor and a manufacture method thereof, wherein a third substrate is disposed between a package body and a MEMS element to function as the cover of the MEMS element, and wherein the MEMS element is connected with the cover and generates a movement corresponding to the deformation of the cover, whereby the leads inside the force sensor are far away from the stress source generated by pressing actions, and whereby the MEMS element is less likely to be damaged by repeated pressing actions, wherefore the reliability of the sensor is significantly increased. Besides, the present invention can realize force sensors of different specifications via merely modifying the thickness of the third substrate. Thus, the force sensors of different specifications can be packaged in the same package process.

In one embodiment, the force sensor of the present invention comprises a first substrate, a second substrate, a third substrate and a package body. The first substrate includes a fixed electrode, at least one first conductive contact and at least one second conductive contact. The second substrate includes a first surface, a second surface opposite to the first surface, and a MEMS element corresponding to the fixed electrode. The second substrate is disposed in the first substrate with the first surface of the second substrate facing the first substrate. The first surface of the second substrate is electrically connected with the first conductive contact of the first substrate. The third substrate is disposed in the second surface of the second substrate. The third substrate includes a pillar connected with the MEMS element. The package body covers the first substrate, the second substrate and the third substrate.

In one embodiment, the method for manufacturing a force sensor comprises steps: providing a third substrate and defining at least one first connection member and a pillar; providing a second substrate including a first surface and a second surface opposite to the first surface; facing the second surface to the third substrate, and joining the second substrate to the first connection member and the pillar of the third substrate; defining at least one second connection member in the first surface of the second substrate; defining a MEMS element in the second substrate, wherein the MEMS element is connected with the pillar; providing a first substrate including a fixed electrode, at least one conductive contact and at least one second conductive contact; joining the first substrate and the second substrate together, wherein the at least one first conductive contact is electrically connected with the at least one second connection member, and the MEMS element is corresponding to the fixed electrode; and using a package body to cover the first substrate, the second substrate and the third substrate.

Below, embodiments are described in detail in cooperation with the attached drawings to make easily understood the objectives, technical contents, characteristics and accomplishments of the present invention.

DESCRIPTION OF THE PREFERRED EMBODIMENTS

Figure 1:
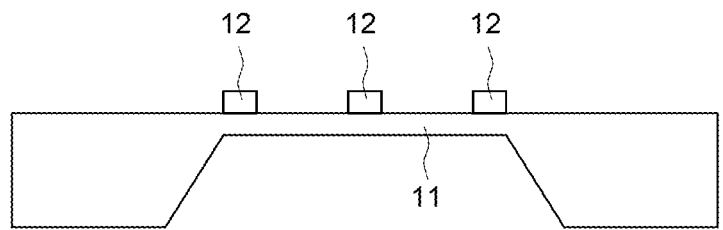
FIG. 1 is a diagram schematically showing a conventional piezoresistor type pressure sensor.
Figure 2:
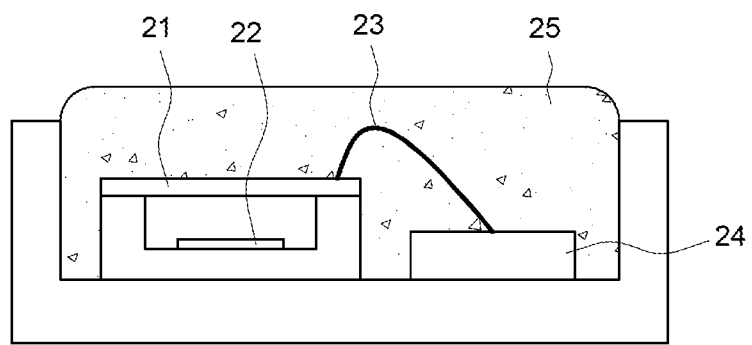
FIG. 2 is a diagram schematically showing a conventional capacitor type pressure sensor.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Figure 3:
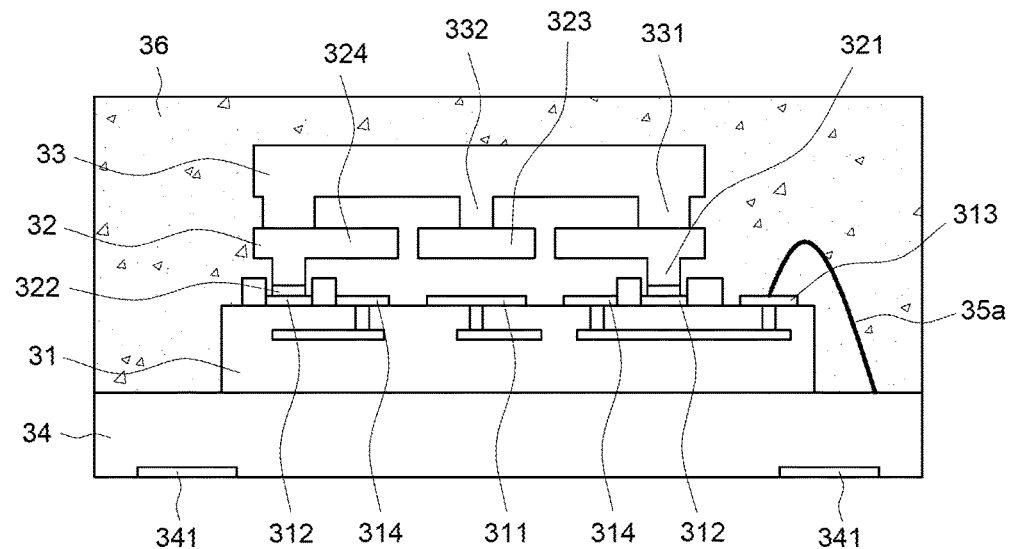
FIG. 3 is a diagram schematically showing a force sensor according to a first embodiment of the present invention.

Refer to FIG. 3. In one embodiment, the force sensor of the present invention includes a first substrate 31, a second substrate 32, a third substrate 33, and a package body 36. The first substrate 31 includes a fixed electrode 311, at least one first conductive contact 312 and at least one second conductive contact 313. In the embodiment shown in FIG. 3, the first substrate 31 has a plurality of metal layers that are connected with each other by interconnection structures. A portion of the topmost metal layer is exposed on the surface of the first substrate 31 to be used as the fixed electrode 311, the first conductive contact 312 and the second conductive contact 313.

The second substrate 32 has a first surface (i.e. the surface of the second substrate 32, which faces downward), a second surface opposite to the first surface and a microelectromechanical system (MEMS) element 323. The second substrate 32 is disposed on the first substrate 31 with the first surface being faced to the first substrate 31 and electrically connected with the first conductive contact 312 of the first substrate 31.

For example, at least one second connection member 321 of the second substrate 32 and a conductive material 322 on the terminal of the second connection member 321 are connected with the first conductive contact 312 of the first substrate 31. The MEMS element 323 and the fixed electrode 311 are opposite to each other to form a sensing capacitor. It is understood that the movement of the MEMS element 323 with respect to the fixed electrode 311 would vary the capacitance of the sensing capacitor. Thus, a detection signal is output.

The third substrate 33 is disposed on the second surface of the second substrate 32 (i.e. the surface of the second substrate 32, which faces upward). For example, the third substrate 33 is connected with the second surface of the second substrate 32 through a first connection member 331 and used as a cover of the second substrate 32. The third substrate 33 has a pillar 332 that is connected with the MEMS element 323 of the second substrate 32. The package body 36 hoods the third substrate 33. For example, the first substrate 31, the second substrate 32 and the third substrate 33 that have been joined together are disposed on a package substrate 34. Next, the second conductive contact 313 of the first substrate 31 and the package substrate 34 are electrically connected with a lead 35*a* by a wire bonding process. Then the package body 36 encapsulates the first substrate 31, the second substrate 32, the third substrate 33 and the lead 35*a* for protecting the abovementioned elements. Thus, the first substrate 31 can be electrically connected with the external device through the second conductive contact 313 and at least one external conductive contact 341 of the package substrate 34.

According to the structure shown in FIG. 3, while the third substrate 33 is pressed to deform, the pillar 332 will push the MEMS element 323 to move together with the third substrate 33. The force sensor of the present invention can determine whether the force sensor is pressed and the magnitude of the pressing force via measuring the variation of the sensing capacitor. In other words, the pressing force does not directly act on the MEMS element 323 of the present invention so as not to do damages on the MEMS element 323 by repeated pressing actions. Besides, as shown in FIG. 3, the arrangement that pressing action puts force on the third substrate 33 makes the lead 35*a* far away from the stress source of pressing action so as to significantly increase the reliability of the wire bonding structure and the force sensor of the present invention. It is noted that the range of measured force can be adjusted via modifying the thickness of the MEMS system 323, the design of the elastic arm of the MEMS element 323 or the material/thickness of the package body. Further, the range of measured force, such as 10 newtons or 100 newtons, can be adjusted via modifying the thickness of the third substrate. Therefore, the force sensors for measuring different ranges of force can be packaged with the same package process.

Figure 4:
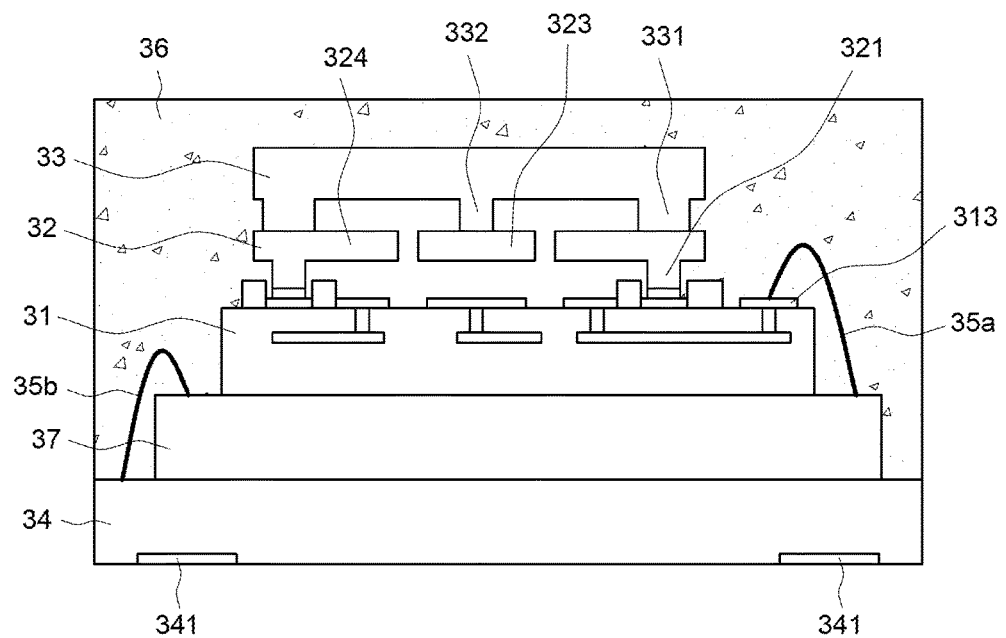
FIG. 4 is a diagram schematically showing a force sensor according to a second embodiment of the present invention.

In one embodiment, the first substrate 31 includes a driver circuit and/or a sensing circuit. For example, the first substrate 31 may have an analog and/or digital circuit, which is normally realized by an Application Specific Integrated Circuit (ASIC). However, the present invention is not limited by the abovementioned embodiment. In one embodiment, the first substrate 31 is also called the electrode substrate. For example, the first substrate 31 may be a substrate having appropriate rigidity, such as a complementary metal oxide semiconductor (CMOS) substrate or a glass substrate. Refer to FIG. 4. In the embodiment shown in FIG. 4, the force sensor of the present invention further comprises an ASIC chip 37. In the embodiment shown in FIG. 4, the first substrate 31 is stacked on the ASIC chip 37; the second conductive contact 313 of the first substrate 31 is electrically connected with the ASIC chip 37 through the lead 35*a*, and the ASIC chip 37 is further electrically connected with the package substrate 34 through a lead 35*b*. Via the abovementioned structure, the first substrate 31 can be electrically connected with an external device through the second conductive contact 313, the ASIC chip 37, and the external conductive contact 341 of the package substrate 34. It is understood that the force sensor of the present invention may be implemented by the case that the first substrate 31 and the ASIC chip 37 are disposed on the same plane side by side.

Figure 5:
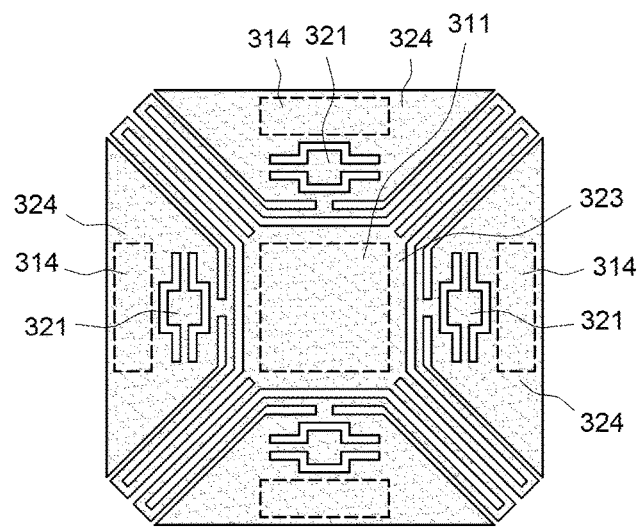
FIG. 5 is a top view schematically showing a second substrate of a force sensor according to a third embodiment of the present invention.

Refer to FIG. 3 again. In one embodiment, the first substrate 31 further includes at least one reference electrode 314, and the second substrate 32 further includes at least one reference element 324; the reference electrode 314 and the reference element 324 are opposite to each other to form a reference capacitor. The reference capacitor and the sensing capacitor jointly form a differential capacitor pair, whereby to improve the precision of measurement. It is noted that the reference element 324 of the second substrate 32 is a fixed element, as shown in FIG. 3. However, the present invention is not limited by the abovementioned embodiment. In one embodiment, the reference element 324 is a movable element, as shown in FIG. 5. In the embodiment shown in FIG. 5, the MEMS element 323 and the reference element 324 of the second substrate 32 form a seesaw structure with the second connection member 321 being the anchor point. According to the abovementioned seesaw structure, while the MEMS element 323 is moved downward by the pressing stress, the reference element 324 is moved upward. Therefore, a tiny magnitude of movement can be measured using the difference between the capacitance variation of the sensing capacitor and the capacitance variation of the reference capacitor. Thus is increased the precision of measurement.

Figure 6:
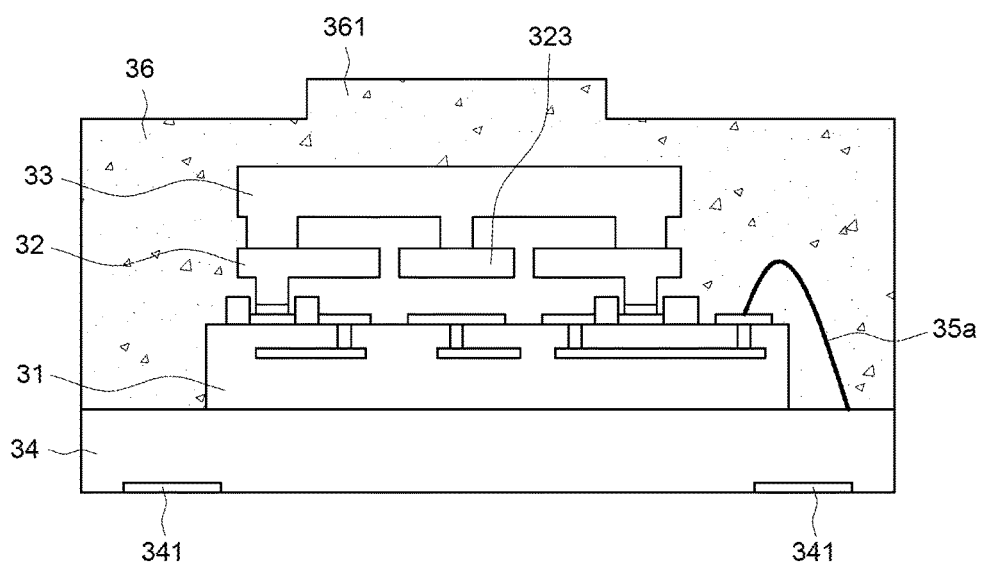
FIG. 6 is a diagram schematically showing a force sensor according to a fourth embodiment of the present invention.

Refer to FIG. 6. In one embodiment, the package body 36 includes a protrusion 361. The protrusion 361 is corresponding to the MEMS element 323. In other words, the protrusion 361 is corresponding to the third substrate 33, and more exactly, corresponding to the pillar 332 of the third substrate 33. The assemblage errors may result in different measurement errors. The protrusion 361 concentrates the pressing force thereon, whereby the force sensor of the present invention still outputs more consistent measurement results under different assemblage errors.

Figure 7:
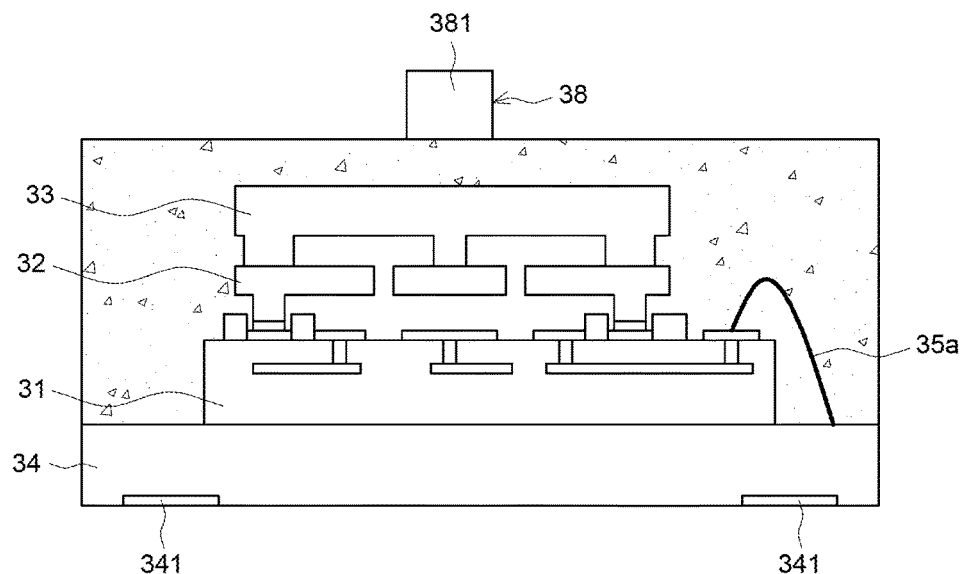
FIG. 7 is a diagram schematically showing a force sensor according to a fifth embodiment of the present invention.
Figure 8:
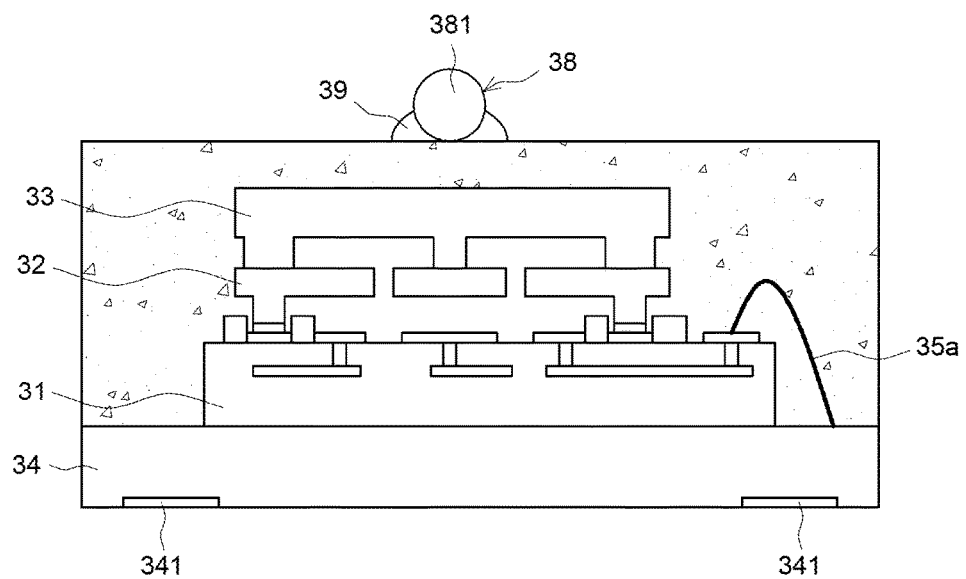
FIG. 8 is a diagram schematically showing a force sensor according to a sixth embodiment of the present invention.

Refer to FIG. 7. In one embodiment, the force sensor of the present invention further includes a protrudent member 38 disposed on the package body 36. The protrudent member 38 has a bump 381 that is corresponding to the MEMS element 323. Similar to the protrusion 361 of the package body 36, the bump 381 protrudes from the package body 36 and concentrates the pressing force thereon so as to allow the force sensor of the present invention to tolerate a larger range of assemblage error. In the embodiment shown in FIG. 7, the top surface of the bump 381 is a plane. However, the present invention is not limited by the embodiment. Refer to FIG. 8. In one embodiment, the top surface of the bump 381 is a curved face. It is understood that the bump 381 can be attached to the package body 36 by an adhesive 39.

Figure 9:
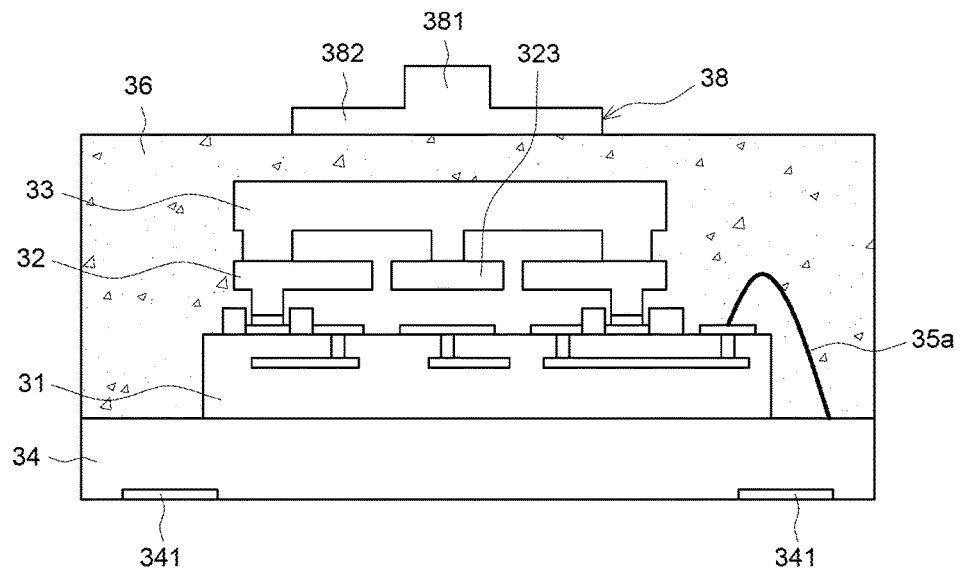
FIG. 9 is a diagram schematically showing a force sensor according to a seventh embodiment of the present invention.
Figure 10:
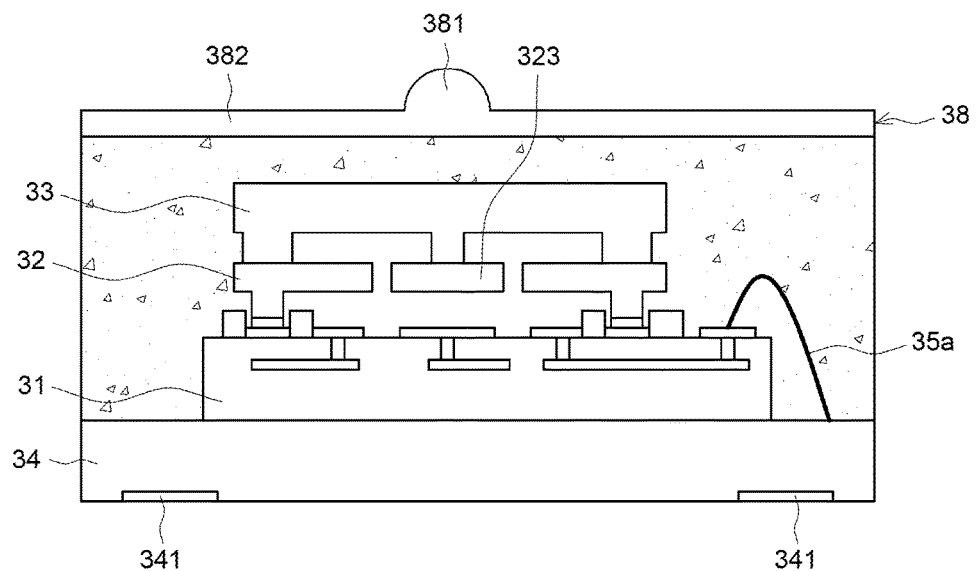
FIG. 10 is a diagram schematically showing a bump of a force sensor according to the seventh embodiment of the present invention.

Refer to FIG. 9. In one embodiment, the protrudent member 38 has a bump 381 and a plate 382, wherein the plate 382 is arranged between the bump 381 and the package body 36. In one embodiment, the bump 381 and the plate 382 of the protrudent member 38 are fabricated into a one-piece component. In one embodiment, the bump 381 and the plate 382 are made of a metallic material. The projection area of the plate 382 is smaller than or equal to the area of the third substrate 33. In the embodiment shown in FIG. 9, the plate 382 is corresponding to the deformed area of the third substrate 33. Refer to FIG. 10. In one embodiment, the projection area of the plate 382 is larger the area of the third substrate 33 and covers the upper surface of the package body 36. Similarly, the top surface of the bump 381 may be a plane (as shown in FIG. 9) or a curved surface (as shown in FIG. 10). It should be further mentioned herein: the thickness of the plate 382 can also be used to control the measurement range of the force sensor of the present invention.

Figure 11:
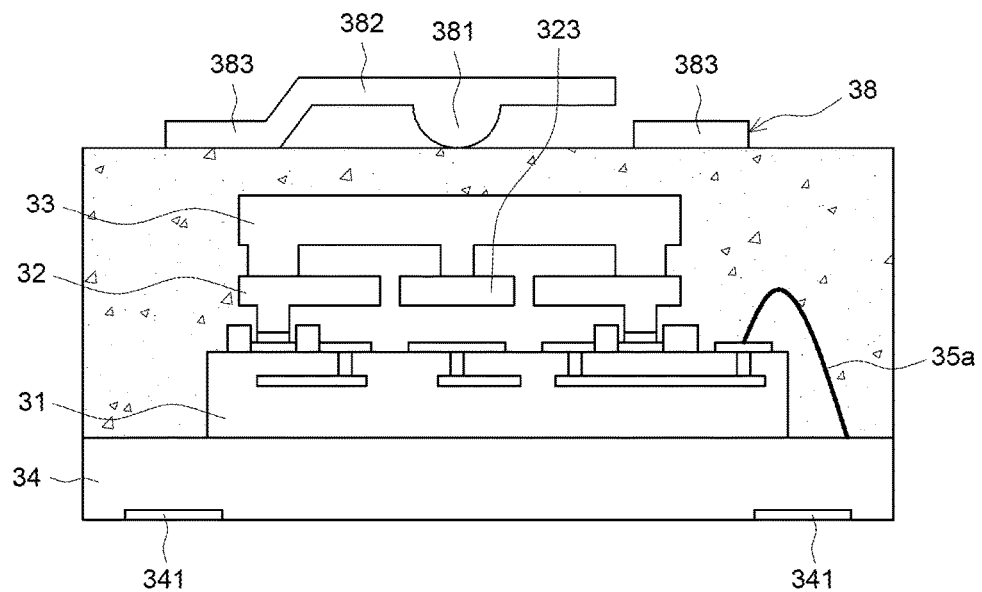
FIG. 11 is a diagram schematically showing a force sensor according to an eighth embodiment of the present invention.
Figure 12:
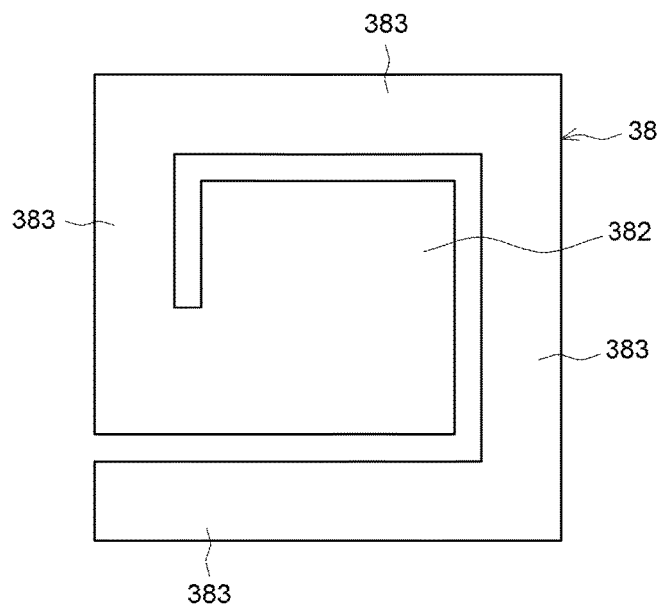
FIG. 12 is a diagram schematically showing a force sensor according to a ninth embodiment of the present invention.

Refer to FIG. 11 and FIG. 12. In one embodiment, the plate 382 is disposed above the bump 381. In other words, the bump 381 is arranged between the plate 382 and the package body 36. In such a structure, while the plate 382 is pressed, the stress is concentrated on the bump 381. Thus is further increased the tolerance of the force sensor of the present invention to the assemblage errors. In one embodiment, the plate 382 has at least one connection leg 383. The connection leg 383 is joined with the package body 36 to prevent the plate 382 from being tilted by pressing actions.

Figure 13:
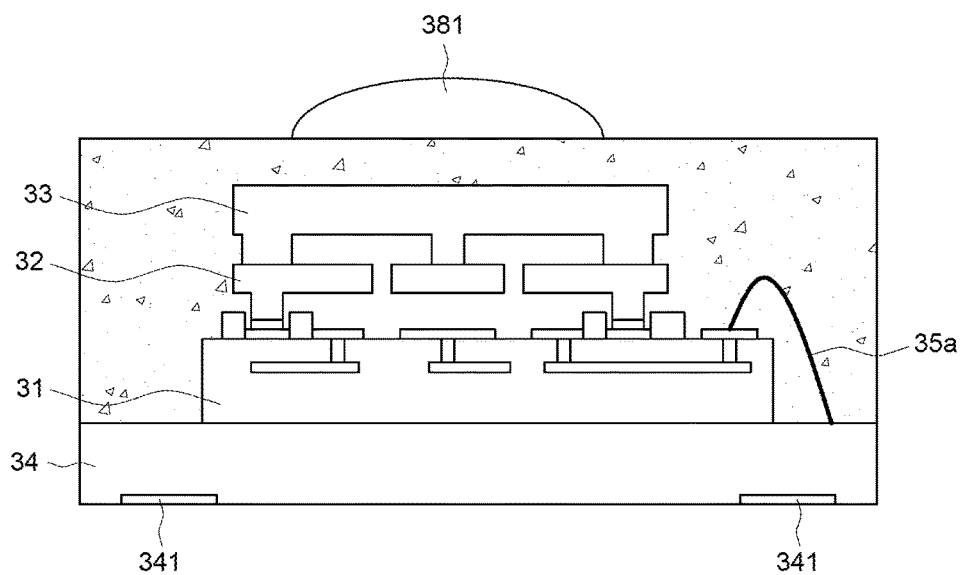
FIG. 13 is a diagram schematically showing a force sensor according to a tenth embodiment of the present invention.

Refer to FIG. 13. In one embodiment, the bump 381 is formed via a glue-dispensing method. It is understood that the bump 381 is made of a polymeric material in this embodiment.

Refer to FIGS. 14a-14j for the description of the manufacture method of the force sensor of the present invention shown in FIG. 3. Only a single device is shown in these drawings. However, it is understood that a plurality of devices may be fabricated on a single substrate, and the single device shown in these drawings is only an exemplification; the present invention is not limited by the exemplification. The specification will further describe the method of using a wafer-scale process to fabricate a plurality of chips or devices on a substrate. After the devices have been fabricated on a substrate, a dicing technology or a singulation technology will be used to generate individual devices, and the individual devices will be packaged separately for applications.

Figure 14A:
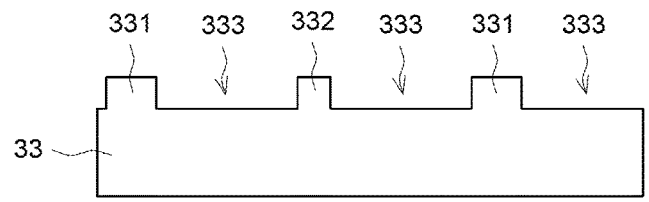
FIGS. 14*a*-14*j* are diagrams schematically showing the steps pf manufacturing the force sensor of the first embodiment.

Refer to FIG. 14a. Firstly, a third substrate 33 is provided and at least one first connection member 331 and a pillar 332 in the third substrate 33 are defined. In one embodiment, the third substrate 33 is etched to form a plurality of trenches 333, whereby to define the first connection member 331 and the pillar 332.

Figure 14B:
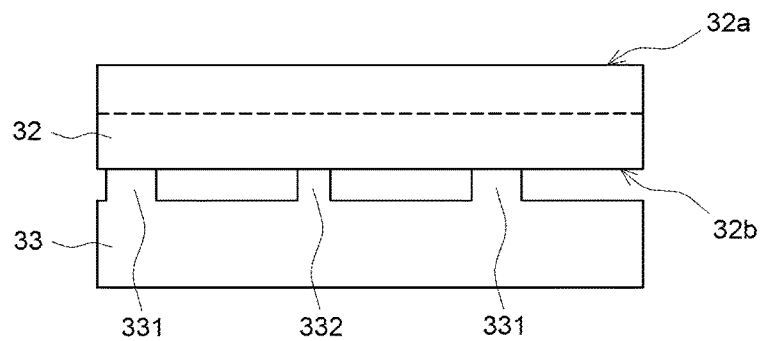

Refer to FIG. 14b. Next, a second substrate 32 is provided to include a first surface 32a and a second surface 32b opposite to the first substrate 32a. The second surface 32b of the second substrate 32 is faced to the third substrate 33, and then the second surface 32b is jointed to the first connection member 331 and the pillar 332 of the third substrate 33. In one embodiment, the second substrate 32 and the third substrate 33 are joined together in a fusion bond method. In one embodiment, after the second substrate 32 and the third substrate 33 have been joined together, the second substrate 32 is thinned. In one embodiment, the second substrate 32 is thinned to have a thickness of equal to or smaller than 30 µm.

Figure 14C:
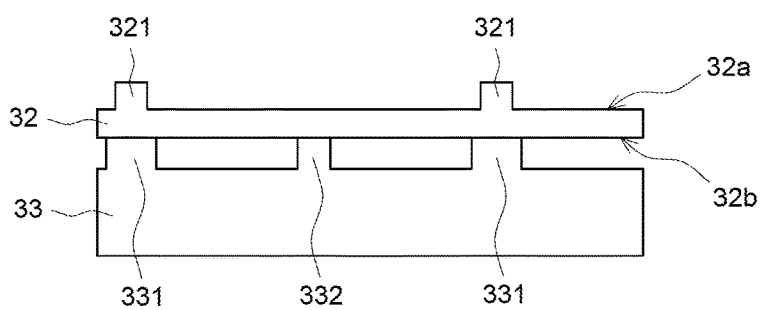
Figure 14D:
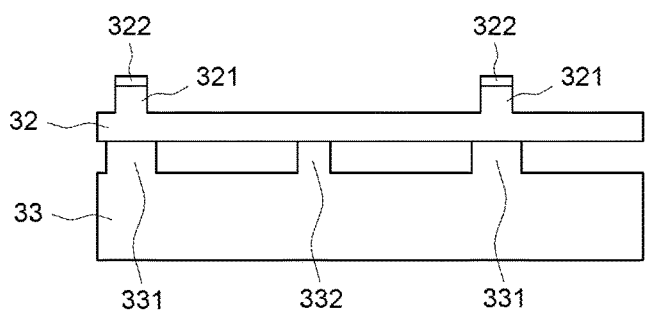

Refer to FIG. 14c. Next, at least one second connection member 321 on the first surface 32a of the second substrate 32 is defined. Refer to FIG. 14d. In one embodiment, according to the method of joining the second substrate 32 and a first substrate 31 in the subsequent step, an appropriate joining material is formed on the second connection member 321. In one embodiment, the joining material is a conductive material 322.

Figure 14E:
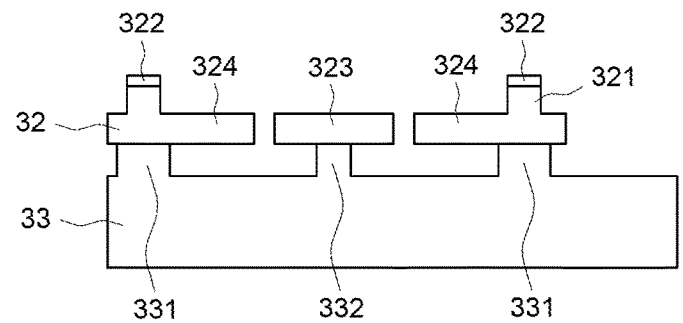

Refer to FIG. 14e. Next, a MEMS element 323 in the second substrate 32 is defined. It is noted that the MEMS element 323 of the second substrate 32 must be joined to the pillar 332 of the third substrate 33. In one embodiment, at least one reference element 324 is defined simultaneously while the MEMS element 323 is defined.

Figure 14F:
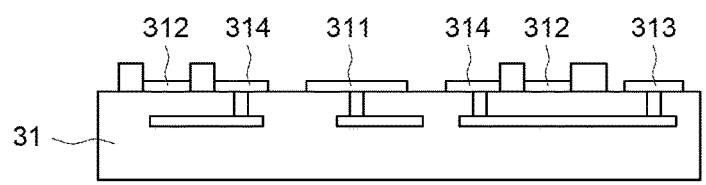

Refer to FIG. 14f. Next, a first substrate 31 is provided to include a fixed electrode 311, at least one first conductive contact 312 and at least one second conductive contact 313. In one embodiment, the first substrate 31 also includes a reference electrode 314.

Figure 14G:
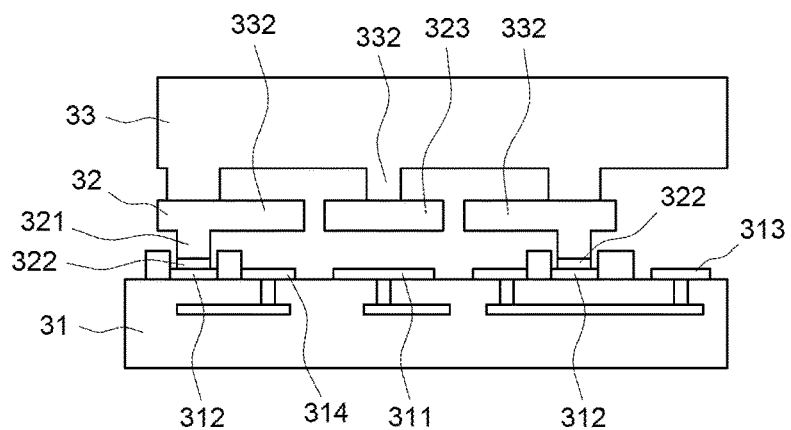

Refer to FIG. 14g. Next, the first substrate 31 is jointed to the second substrate 32, wherein the first conductive contact 312 of the first substrate 31 is electrically connected with the second connection member 321 of the second substrate 32 through the conductive material 322, and wherein the MEMS element 323 is corresponding to the fixed electrode 311. In one embodiment, the second substrate 32 is joined to the first substrate 31 in at least one of an eutectic bonding method, a fusion bond method, a soldering method and an adhesive method.

Figure 14H:
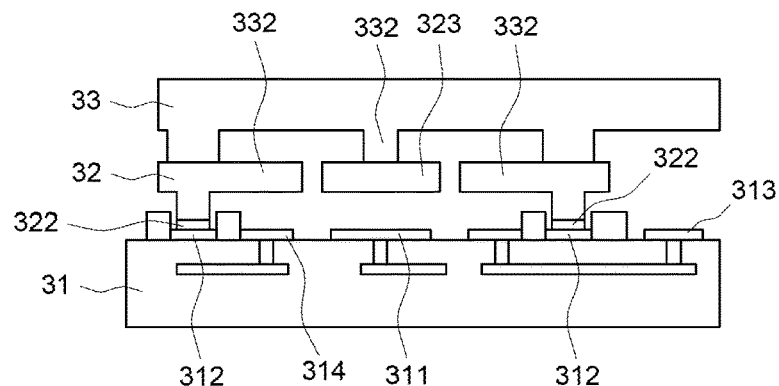
Figure 14I:
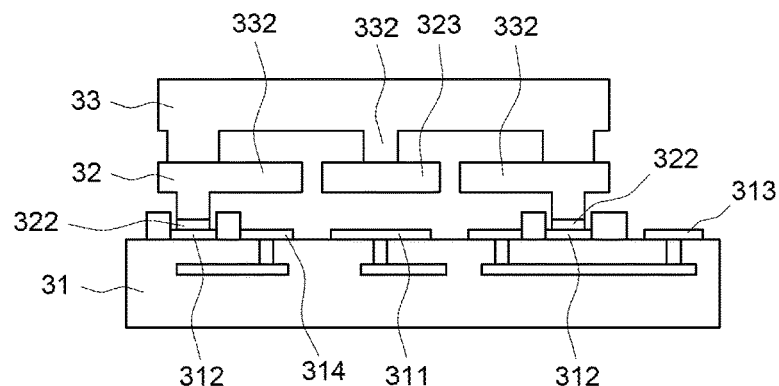
Figure 14J:
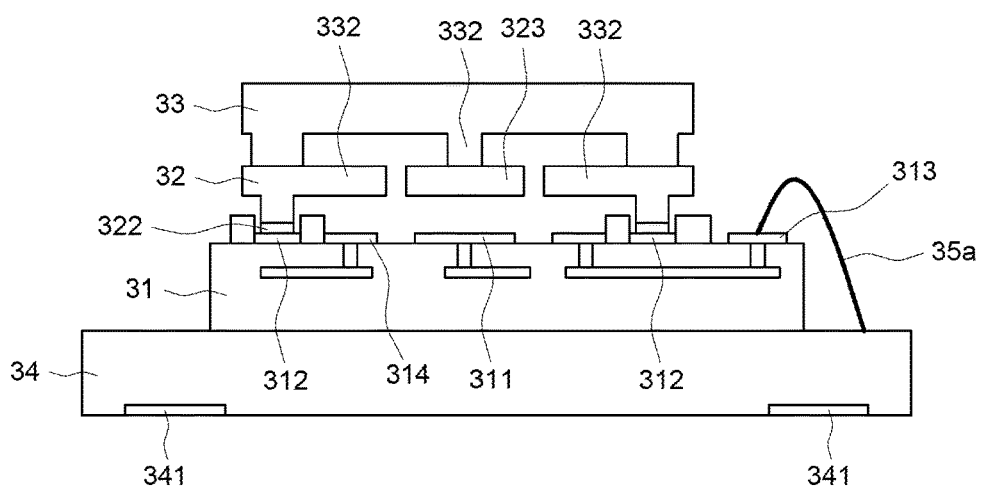

Refer to FIG. 14h. Next, the third substrate 33 is thinned to have an appropriate thickness. Refer to FIG. 14i. Next, a portion of the third substrate 33 is removed to expose the second conductive contact 313 of the first substrate 31. Next, the first substrate 31 is diced for the subsequent package process. Refer to FIG. 14j. In one embodiment, the singulated first substrate 31 is placed on a package substrate 34, and use a lead 35a to electrically connect the second conductive contact 313 of the first substrate 31 to the package substrate 34. Then, a package body 36 is used to cover the third substrate 33 to form the force sensor shown in FIG. 3. It is understood that an appropriate mold can be used in a molding package process to form the protrusion 361 shown in FIG. 6.

In the present invention, the force sensors with different package designs are realized in different package processes. For example, in packaging the force sensor shown in FIG. 4, the first substrate 31 is disposed on the ASIC chip 37; next, at least one second conductive contact 313 of the first substrate 31 is electrically connected with the ASIC chip 37 through the lead 35a; then, the package body 36 is used to cover all the elements. In one embodiment, the force sensor of the present invention and the ASIC chip are disposed on the package substrate side by side; then, wire bonding and molding package are undertaken to complete the sensor.

In one embodiment, the manufacture method of the force sensor of the present invention further includes a step of forming a protrudent member 38 having a bump 381 on the package body 36, as shown in FIGS. 7-12. In one embodiment, the bump 381 is formed on the package body 36 in a glue-dispensing method, as shown in FIG. 13.

In conclusion, the present invention proposes a force sensor, wherein a third substrate is disposed between a package body and a MEMS element to function as the cover of the MEMS element, whereby the MEMS element is spatially separated from the package body. The MEMS element is connected with the cover and generates a movement corresponding to the deformation of the cover. Thereby, the leads inside the force sensor are far away from the stress source generated by pressing actions, and the MEMS element is less likely to be damaged by repeated pressing actions. Thus, the reliability of the sensor is significantly increased. Besides, the present invention can realize force sensors of different specifications via merely modifying the thickness of the third substrate. Therefore, the force sensors of different specifications can be packaged in the same package process.

What is claimed is:

1. A force sensor comprising:
   a first substrate including a fixed electrode, at least one reference electrode, at least one first conductive contact and at least one second conductive contact;
   a second substrate including a first surface, a second surface opposite to the first surface, and a microelectromechanical system (MEMS) element opposite to the fixed electrode, at least one reference element corresponding to the at least one reference electrode and at least one second connection member, wherein:
      the second substrate is disposed on the first substrate with the first surface of the second substrate facing the first substrate;
      the at least one second connection member of the second substrate is electrically connected with the at least one first conductive contact;
      the fixed electrode and the microelectromechanical system (MEMS) form a sensing capacitor, the at least one reference electrode and the at least one reference element form a reference capacitor, and the reference capacitor and the sensing capacitor jointly form a differential capacitor pair; and
      the microelectromechanical system (MEMS) and the at least one reference element form a seesaw structure with the at least one second connection member being an anchor point;
   a third substrate disposed on the second surface of the second substrate and including a pillar connected with the MEMS element; and
   a package body covering the first substrate, the second substrate and the third substrate.

2. The force sensor according to claim 1, wherein the at least one reference element is a fixed element.

3. The force sensor according to claim 1, wherein the at least one reference element is a movable element.

4. The force sensor according to claim 1, wherein the first substrate includes a complementary metal oxide semiconductor (CMOS) substrate.

5. The force sensor according to claim 1, wherein the first substrate includes an application specific integrated circuit (ASIC).

6. The force sensor according to claim 1 further comprising
   an ASIC chip, wherein the first substrate is stacked on the ASIC chip or disposed beside the ASIC chip on the same plane, and wherein the at least one second conductive contact of the first substrate is electrically connected with the ASIC chip through a lead.

7. The force sensor according to claim 1, wherein the package body includes a protrusion corresponding to the MEMS element.

8. The force sensor according to claim 1 further comprising
   a protrudent member disposed on the package body and including a bump corresponding to the MEMS element.

9. The force sensor according to claim 8, wherein a top surface of the bump is a plane or a curved surface.

10. The force sensor original according to claim 8, wherein the bump is made of a metallic material or a polymeric material.

11. The force sensor according to claim 8, wherein the protrudent member includes a plate disposed between the bump and the package body or disposed above the bump.

12. The force sensor according to claim 11, wherein a projection area of the plate is smaller than or equal to an area of the third substrate.

13. The force sensor according to claim 11, wherein the plate is disposed between the bump and the package body and covers the package body.

14. The force sensor according to claim 11, wherein the plate is disposed above the bump and includes at least one connection leg connected with the package body.

\* \* \* \* \*